(12) United States Patent
Kang

(10) Patent No.: US 7,888,696 B2
(45) Date of Patent: Feb. 15, 2011

(54) SEMICONDUCTOR LIGHT EMITTING DEVICE AND A METHOD FOR MANUFACTURING THE SAME

(75) Inventor: Dae Sung Kang, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 467 days.

(21) Appl. No.: 11/971,813

(22) Filed: Jan. 9, 2008

(65) Prior Publication Data

US 2008/0169482 A1   Jul. 17, 2008

(30) Foreign Application Priority Data

Jan. 11, 2007   (KR) ...................... 10-2007-0003538

(51) Int. Cl.
*H01L 33/00* (2010.01)

(52) U.S. Cl. ................................. 257/98; 257/E33.068

(58) Field of Classification Search ............... 257/98, 257/E33.068
See application file for complete search history.

(56) References Cited

U.S. PATENT DOCUMENTS

| | | | |
|---|---|---|---|
| 2005/0230699 A1* | 10/2005 | Wu et al. | 257/98 |
| 2008/0142824 A1* | 6/2008 | Chen et al. | 257/98 |
| 2008/0283859 A1* | 11/2008 | Chen et al. | 257/98 |
| 2010/0219437 A1* | 9/2010 | Usuda et al. | 257/98 |

* cited by examiner

*Primary Examiner*—Minh-Loan T Tran
(74) *Attorney, Agent, or Firm*—Birch, Stewart, Kolasch & Birch, LLP

(57) ABSTRACT

Disclosed is a semiconductor light emitting device comprising a reflective structure layer comprising a dopant layer and a roughness layer, a first conductive semiconductor layer on the reflective structure layer, an active layer on the first conductive semiconductor layer, and a second conductive semiconductor layer on the active layer.

20 Claims, 5 Drawing Sheets

US 7,888,696 B2

SEMICONDUCTOR LIGHT EMITTING DEVICE AND A METHOD FOR MANUFACTURING THE SAME

The present application claims priority under 35 U.S.C. 119 and 35 U.S.C. 365 to Korean Patent Application No. 10-2007-0003538 (filed on Jan. 11, 2007), which is hereby incorporated by reference in its entirety.

BACKGROUND

Light emitting diodes (LEDs) can emit light having various colors using characteristics of semiconductor materials such as GaAs, AlGaAs, GaN, InGaN, and InGaAlP-based compound semiconductor materials. Such LEDs are packaged to be applied to various fields such as a lightening indicator, a character indicator, and an image indicator.

In such LEDs, an N-type semiconductor layer, an active layer, and a P-type semiconductor layer are stacked, so that light is emitted from the active layer and discharged to an exterior as power is applied to the LEDs.

SUMMARY

The embodiment provides a semiconductor light emitting device and a method for manufacturing the same, capable of forming a reflective structure layer below an active layer.

The embodiment provides a semiconductor light emitting device and a method for manufacturing the same, capable of improving external quantum efficiency by forming a reflective structure layer, which comprises a roughness layer using a dopant as a seed, between a substrate and an active layer.

The embodiment provides a semiconductor light emitting device, comprising: a reflective structure layer comprising a dopant layer and a roughness layer, a first conductive semiconductor layer on the reflective structure layer, an active layer on the first conductive semiconductor layer, and a second conductive semiconductor layer on the active layer.

The embodiment provides a semiconductor light emitting device, comprising: a first nitride semiconductor layer, a first reflective structure layer comprising a dopant layer and a roughness layer comprising a concave-convex shape, on the first nitride semiconductor layer, a first conductive semiconductor layer on the first reflective structure layer, an active layer on the first conductive semiconductor layer, and a second conductive semiconductor layer on the active layer.

The embodiment provides a method for manufacturing a semiconductor light emitting device, comprising: forming a dopant layer on a first nitride semiconductor layer, forming a roughness layer, which comprises a concave-convex shape, on the dopant layer, forming a first conductive semiconductor layer on the roughness layer, forming an active layer on the first conductive semiconductor layer, and forming a second conductive semiconductor layer on the active layer.

DETAILED DESCRIPTION OF THE EMBODIMENTS

Hereinafter, a semiconductor light emitting device according to the embodiments will be described in detail with respect to accompanying drawings.

Figure 1:
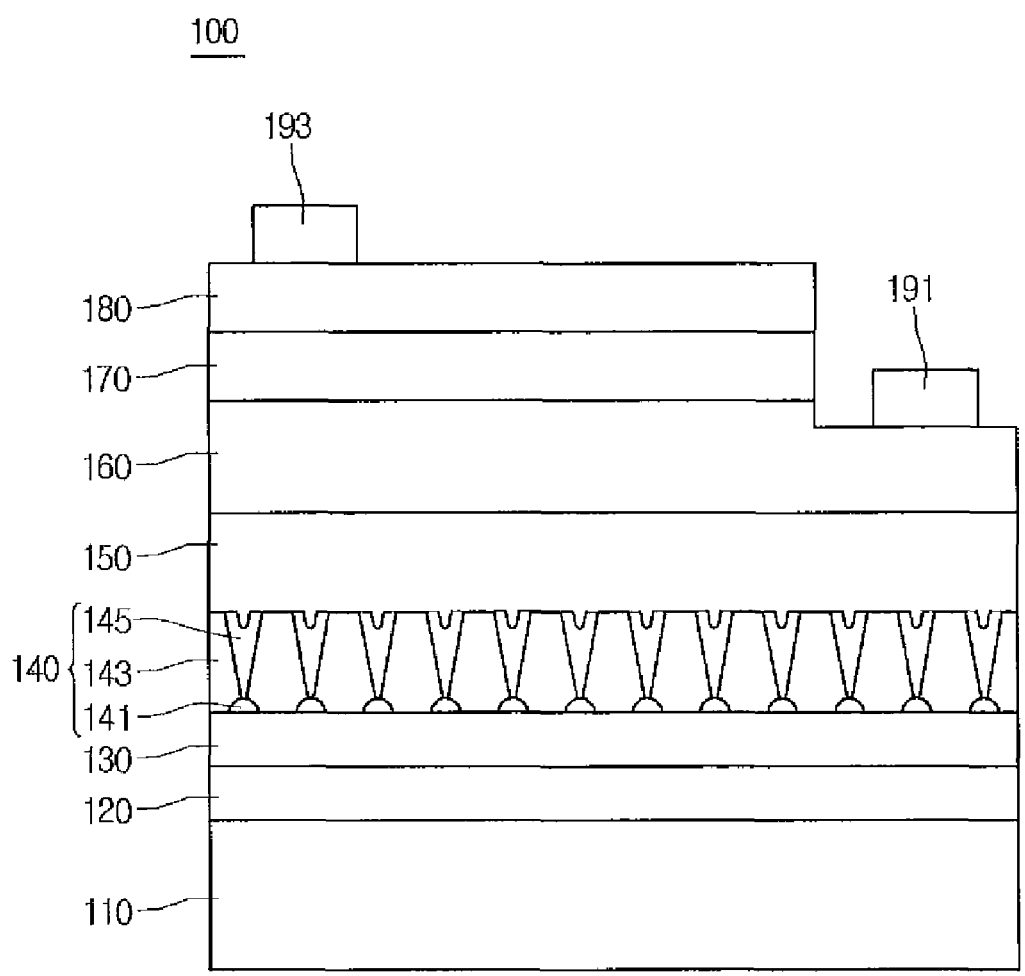
FIG. 1 is a side sectional surface of a semiconductor light emitting device according to the first embodiment.

FIG. 1 is a side sectional surface of a semiconductor light emitting device 100 according to the first embodiment.

Referring to FIG. 1, the semiconductor light emitting device 100 comprises a substrate 110, a buffer layer 120, a first semiconductor layer 130, a reflective structure layer 140, a second semiconductor layer 150, a first conductive semiconductor layer 160, an active layer 170, a second conductive semiconductor layer 180, a first electrode 191, and a second electrode 193.

The substrate 110 can be selected from the group consisting of sapphire ($Al_2O_3$), GaN, SiC, ZnO, Si, GaP and GaAs substrates, and can be removed after any electrode is formed.

The buffer layer 120 is formed on the substrate 110. The buffer layer 120 is to reduce a lattice constant in relation to the substrate 110. The buffer layer 120 may comprise at least one of GaN, InN, AlN, AlInN, InGaN, AlGaN or InAlGaN, and comprises a single-layer structure, a multi-layer structure, or an ultra-lattice structure. The first semiconductor layer 130 may comprise undoped GaN. At least one of the buffer layer 120 and the first semiconductor layer 130 may exist.

The reflective structure layer 140 is formed on the first semiconductor layer 130. The reflective structure layer 140 is roughly formed on the first semiconductor layer 130, thereby improving external quantum efficiency. The reflective structure layer 140 comprises a dopant layer 141, a roughness layer 143, and a reflective layer 145. The dopant layer 141 is provided in the form of grains by delta-doping on the first semiconductor layer 130 with N-type dopants (e.g., Si, Ge, Sn, Se, Te, etc.) or P-type dopants (e.g., Mg, Be, Zn etc.).

The roughness layer 143 formed on the dopant layer 141 comprises a concave-convex shape. Such a roughness layer 143 comprises a nitride semiconductor such as GaN, InN, AlN, InGaN, AlGaN or InAlGaN.

The roughness layer 143 may be formed the shape of an asymmetrical polyhedron, such as a hexahedron or a trapezoid having upper/lower portions asymmetrical to each other, due to the dopant layer 141. Each roughness of the roughness layer 143 comprises a vertical length, which is longer than a lateral width by one time to five times. For example, the roughness comprises the vertical length in the range of 100 nm to 1 um, and the lateral width corresponding to ⅕ of the vertical length.

The reflective layer 145 may be formed in a concave portion of the roughness layer 143 by using a reflective material or a material comprising a small reflective index and comprising at lest one of $SiO_2$, $SiO_x$, $SiN_2$, $SiN_x$, $SiO_xN_y$, and ZnO. The reflective layer 145 is formed in the concave portion of the roughness layer 143 such that the roughness layer 143 changes the critical angle of light, thereby improving external quantum efficiency. The reflective layer 145 reflects incident light to prevent the light from being transmitted to the substrate 110.

The second semiconductor layer 150 may be formed on the roughness layer 143 and the reflective layer 145 of the reflective structure layer 140. The second semiconductor layer 150 comprises undoped GaN, and may be formed with a thickness in which a surface of the second semiconductor layer 150 is flat. For example, the second semiconductor layer 150 may be formed a thickness of at least 4 um.

The first conductive semiconductor layer 160 is formed on the second semiconductor layer 150. The first conductive semiconductor layer 160 can be selected from a nitride semiconductor such as GaN, InN, AlN, InGaN, AlGaN, or InAlGaN. The first conductive semiconductor layer 160 is an N-type semiconductor layer, and is doped with N-type dopant such as Si, Ge, Sn, Se, or Te.

The active layer 170 is formed on the first conductive semiconductor layer 160. The active layer 170 may comprise a single quantum well (SQW) structure or a multiple quantum well (MQW) structure. For example, the active layer 170 may comprise an InGaN/GaN structure.

The second conductive semiconductor layer 180 is formed on the active layer 170, and comprises a nitride semiconductor such as GaN, AlGaN, InGaN, or InAlGaN. The second conductive semiconductor layer 180 is a P-type semiconductor layer, which is doped with P-type dopant such as Mg, Be, or Zn.

Another semiconductor layers may be added on and/or under the active layer 170. The embodiments are not limited to the above stacking structure of a semiconductor layer. The first conductive semiconductor layer 160, the active layer 170, and the second conductive semiconductor layer 180 may serve as a light emitting structure. Although the N—P type light emitting structure has been described above, the light emitting structure may comprise a P—N, N—P—N, or P—N—P structure. In addition, a transparent electrode layer (not shown) may be formed on the second conductive semiconductor layer 180.

A transparent electrode layer (not shown) may be formed on the second conductive semiconductor layer 180. The second electrode 193 is formed on the second conductive semiconductor layer 180, and the first electrode 191 is formed on the first conductive semiconductor layer 160.

Although the first and second conductive semiconductor layers 160 and 180 have been described as N-type and P-type semiconductor layers, respectively, the first and second conductive semiconductor layers 160 and 180 can be prepared in the form of P-type and N-type semiconductor layers, respectively. In addition, although one reflective structure layer 140 is described in the embodiment, a plurality of reflective structure layers may be formed below the active layer 170. Further, the reflective structure layer 140 may comprise the dopant layer 141 and the roughness layer 143.

FIGS. 2 to 8 are views showing the manufacturing process of a semiconductor light emitting device according to the first embodiment.

Figure 2:
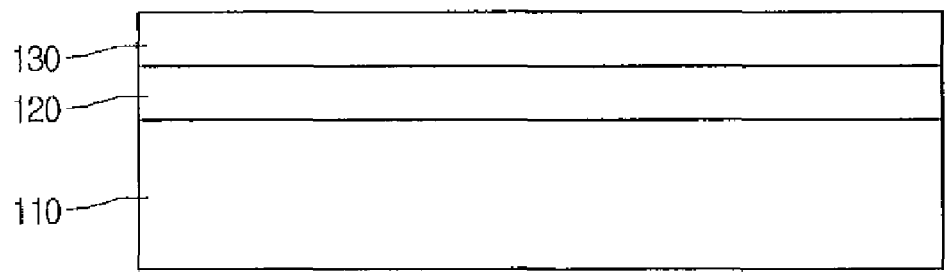
FIGS. 2 to 7 are views showing the manufacturing process of the semiconductor light emitting device according to the first embodiment.

Referring to FIG. 2, the buffer layer 120 is formed on the substrate 110. The buffer layer 120 buffers stress delivered to an epitaxial layer by reducing a lattice constant between the substrate 110 and the epitaxial layer. The above buffer layer 120 may have a signal-layer, multi-layer, or ultra-lattice structure.

The buffer layer 120 is formed thereon with the first semiconductor layer 130 which is not intentionally doped. The first semiconductor layer 130 comprises an undoped GaN layer, and may improve the crystalline quality of a semiconductor thin film formed at the upper portion of the first semiconductor layer 130. For example, the first semiconductor layer 130 may comprise the thickness of several hundreds nm by feeding $NH_3$ gas and Ga gas under the growing temperature in the range of about 900☐ to about 1100☐.

Figure 3:
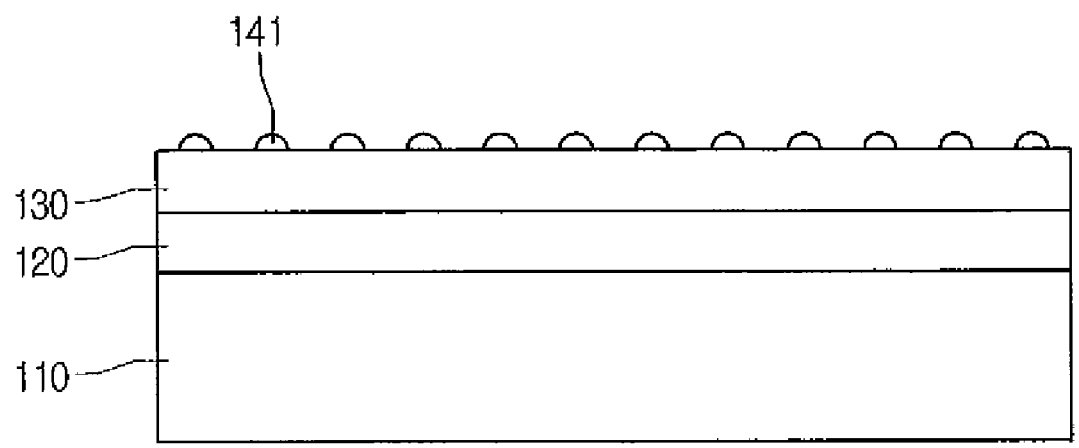

Referring to FIG. 3, the dopant layer 141 of the reflective structure layer is formed on the first semiconductor layer 130. The dopant layer 141 is delta-doped by using an N-type dopant or a P-type dopant, and comprises the form of grains on the surface of the first semiconductor layer 130. The N-type dopant comprises Si, Ge, Sn, Se, or Te, and the P-type dopant comprises Mg, Be, or Zn.

Figure 4:
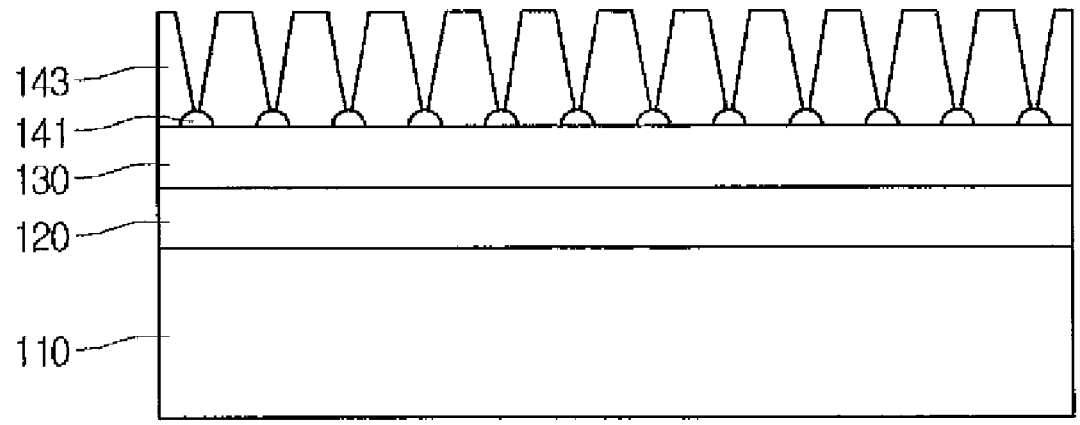

Referring to FIG. 4, the roughness layer 143 is formed on the dopant layer 141. The roughness layer 143 formed on the dopant layer 141 comprises a micro concave-convex structure.

For example, the roughness layer 143 is prepared in the form of the micro concave convex by feeding Ga and $NH_3$ gas at the atmospheric temperature in the range of 800☐ to 1000☐. The aspect ratio of the micro concave-convex structure of the roughness layer 143 can be adjusted by a composition ratio of Ga gas and $NH_3$ gas. Source gas for Ga comprises TMGa or TEGa, and source gas for N comprises $NH_3$, MMHy or DMHy. Such a roughness layer 143 comprises a nitride semiconductor such as GaN, InN, AlN, InGaN, AlGaN, or InAlGaN, and metal organic (MO) gas may be changed according to the semiconductor material. In addition, the roughness layer 143 may be doped with N-type dopant or P-type dopant.

In this case, the concave portion of the roughness layer 143 refers to a region in which dopant exists, and the convex portion of the roughness layer 143 refers to a region in which dopant does not exist. Each roughness of the roughness layer 143 may have the shape of an asymmetrical polyhedron, such as a hexahedron or a trapezoid having upper/lower portions asymmetrical to each other. For example, the ratio of the vertical direction and lateral direction of the micro concave/convex may be 1:5 or 1:1, and the vertical length thereof may be several hundreds nm to several μm (e.g., 100 nm to 1 μm).

In the roughness layer 143, a composition ratio of Ga and $NH_3$ gas and growing time are adjusted so that the size and the density of a micro concave/convex can be controlled. For example, a vertical growth of the roughness layer 143 is active if the Ga gas is very much supplied, and a lateral growth of the roughness layer 143 is active if the $NH_3$ gas is very much supplied. The embodiments can use among not only the Ga gas and $NH_3$ gas but also the group III gas and the group V gas.

Figure 5:
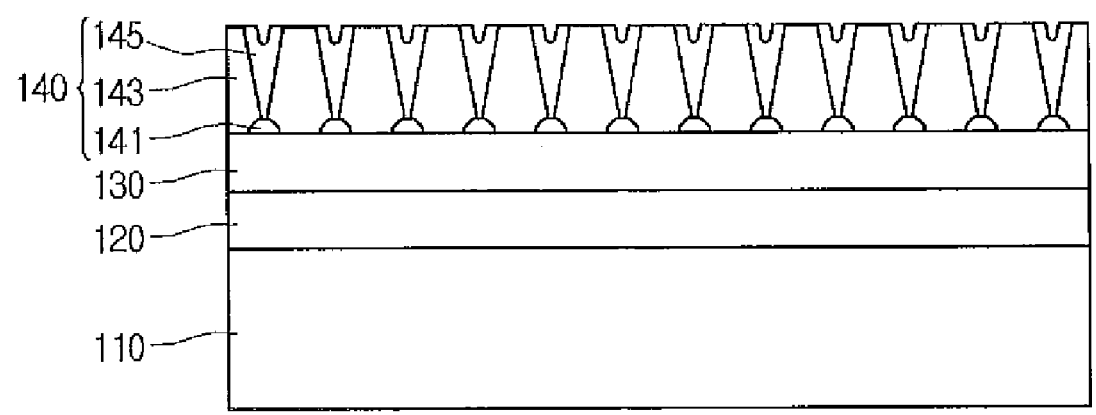

Referring to FIG. 5, the reflective layer 145 is formed on the roughness layer 143. The reflective layer 145 is grown on the entire surface of the roughness layer 143 by using a reflective material at a low atmospheric temperature (e.g., in the range of 400☐~600☐). In this case, the reflective layer 145 is grown as a $Si_xN_y$ layer by feeding a great amount of silane gas and $NH_3$ gas. In this case, the great amount gas represents an amount of gas corresponding to several times of gas supplied to the first conductive semiconductor layer.

Thereafter, the reflective layer 145 is subject to an annealing process at a high temperature (e.g., a temperature in the range of 800☐ to 1000☐). The annealing process is to adjust a ramping rate at the high atmospheric temperature. In the annealing process, the $Si_xN_y$ layer formed on a convex portion of the roughness layer 143 flows into the concave portion of the roughness layer 143. Accordingly, the reflective layer 145 is formed only in the concave portion of the roughness layer 143, and the surface of the convex portion of the roughness layer 143 is used as seeds of a semiconductor layer.

Figure 6:
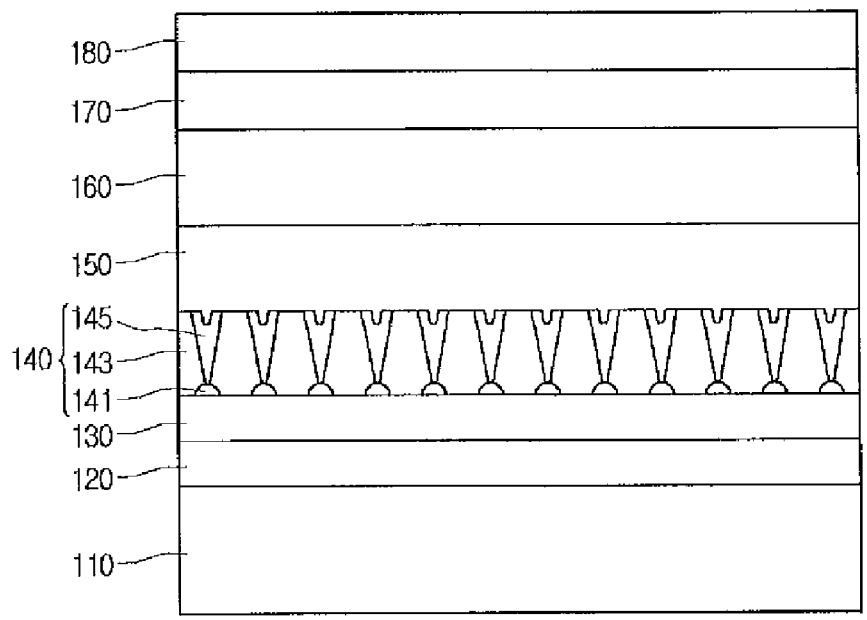

Referring to FIG. 6, it the reflective structure layer 140 is formed, the second semiconductor layer 150 is formed on the roughness layer 143 and the reflective layer 145 of the reflective structure layer 140. The second semiconductor layer 150 may have a thickness capable of covering the roughness layer 143 of the reflective structure layer 140, and comprises undoped GaN. For example, the second semiconductor layer 150 may be formed with a thickness in which a surface of the second semiconductor layer 150 is flat.

Then, the first conductive semiconductor layer 160 is formed on the second semiconductor layer 150. The first conductive layer 160 comprises a nitride semiconductor such as GaN, InN, AlN, InGaN, AlGaN, or InAlGaN. Such a first conductive semiconductor layer 160 is an N-type semiconductor layer, and is doped with N-type dopant such as Si, Ge, Sn, Se, or Te.

The active layer 170 is formed on the first conductive semiconductor layer 160. The active layer 170 may comprise a single quantum well (SQW) structure or a multiple quantum well (MQW).

The second conductive semiconductor layer 180 is formed on the active layer 170, and comprises a nitride semiconductor such as GaN, AlGaN, InGaN, or InAlGaN. The second conductive semiconductor layer 180 is a P-type semiconductor layer, and is doped with P-type dopant such as Mg, Be, or Zn.

Another semiconductor layers may be added on and/or under the active layer 170. The embodiments are not limited to the above stacking structure of a semiconductor layer. The first conductive semiconductor layer 160, the active layer 170, and the second conductive semiconductor layer 180 may serve as a light emitting structure. Although the n-p type light emitting structure has been described above, the light emitting structure may have a P—N, N—P—N, or P—N—P structure. In addition, a transparent electrode layer (not shown) may be formed on the second conductive semiconductor layer 180.

Figure 7:
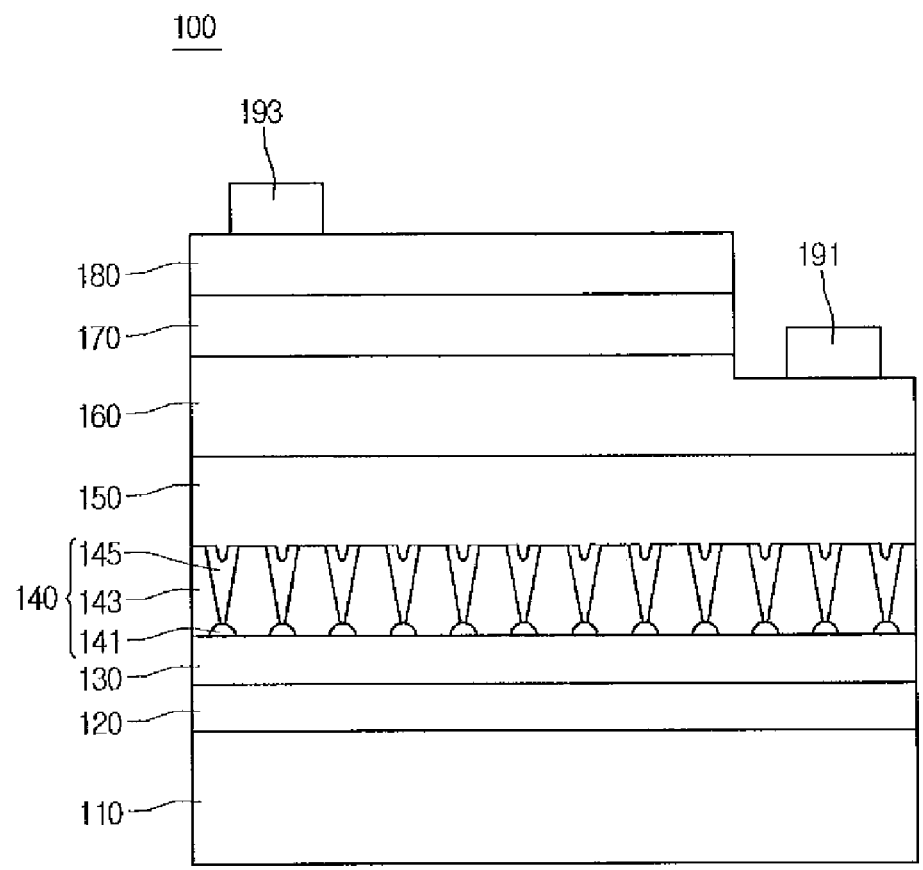

Referring to FIG. 7, a MESA etching process is performed so that the second electrode 193 is formed on the second conductive semiconductor layer 180, and the first electrode 191 is formed on first conductive semiconductor layer 160.

Figure 8:
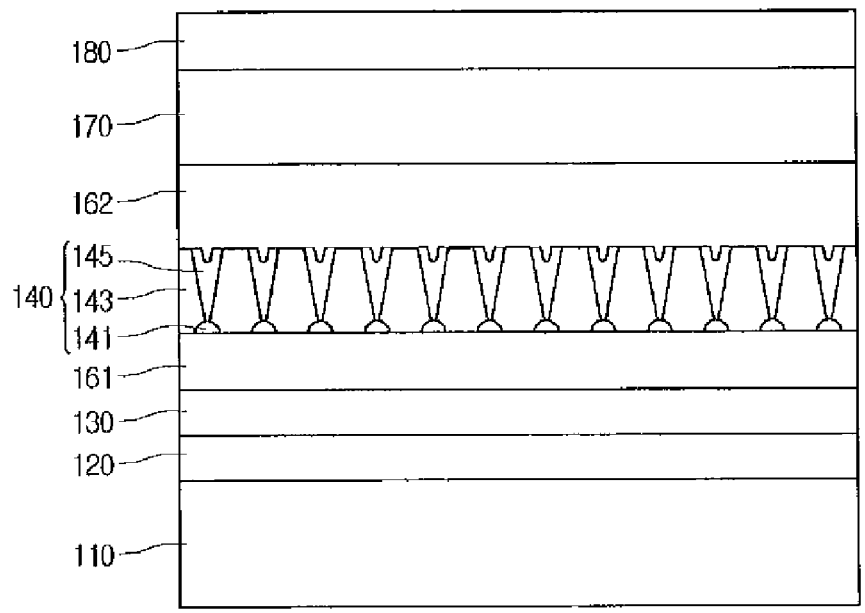
FIG. 8 is a side sectional view showing a semiconductor light emitting device according to the second embodiment.

Meanwhile, FIG. 8 is a side sectional view showing a semiconductor light emitting device 100A according to the second embodiment. Elements and structure identical to those of the first embodiment will not be described in detail in order to avoid redundancy.

Referring to FIG. 8, the semiconductor light emitting device 100A is formed on a substrate 110 with a buffer layer 120 and an undoped semiconductor layer 130. The undoped semiconductor layer 130 is formed thereon with upper and lower first conductive semiconductor layers 161 and 162. In this case, a dopant layer 141, a roughness layer 143, and a reflective layer 145 of a reflective structure layer 140 are formed between the upper and lower first conductive semiconductor layers 161 and 162. Then, an active layer 170 and a second conductive semiconductor layer 180 are formed on the upper first conductive semiconductor layer 162.

Figure 9:
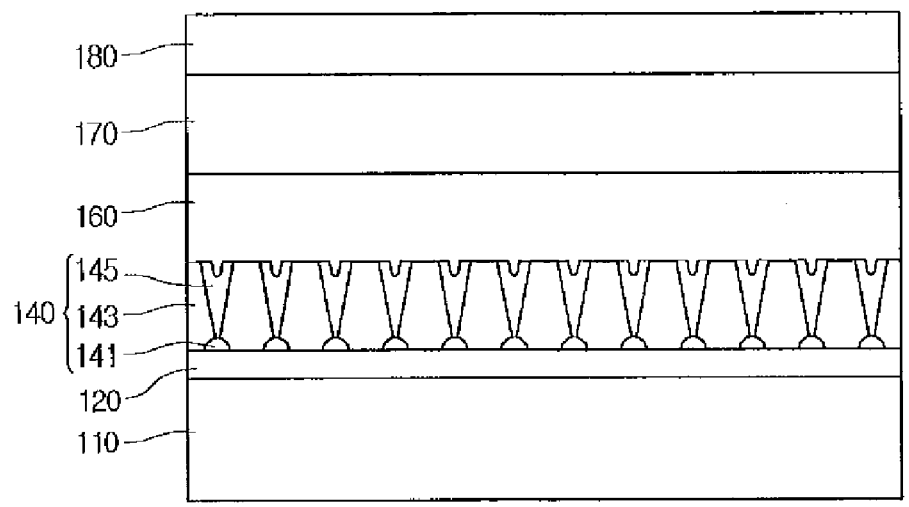
FIG. 9 is a side sectional view showing a semiconductor light emitting device according to the third embodiment.

FIG. 9 is a side sectional view showing a semiconductor light emitting device 100B according to the third embodiment. Elements and structure identical to those of the first embodiment will not be described in detail in order to avoid redundancy.

Referring to FIG. 9, in the semiconductor light emitting device 100B, a reflective structure layer 140 is formed on a buffer layer 120. As a light emitting structure, a first conductive semiconductor layer 160, an active layer 170, and a second conductive semiconductor layer 180 are formed on the reflective structure layer 140. In this case, an undoped semiconductor layer (not shown) may be formed on the reflective structure layer 140.

The embodiments are not limited to the structure of the reflective structure layer 140 disclosed in the first to third embodiments, and the reflective structure layer 140 may be formed below or inside the semiconductor layer below the active layer 170. For example, the reflective structure layer 140 may be formed between the substrate 110 and the buffer layer 120, between the buffer layer 120 and the undoped semiconductor layer, between the undoped semiconductor layer and the first conductive semiconductor layer 160, between undoped semiconductor layers, and between the first conductive semiconductor layers. In addition, a plurality of reflective structure layers may be formed between semiconductors below the active layer 170.

In addition, according to the embodiment, the first conductive semiconductor layer may be a P-type semiconductor layer, and a second electrode layer and a conductive support substrate may be arranged below the P-type semiconductor layer. In this case, the reflective structure layer may be formed between the P-type semiconductor layers or between the P-type semiconductor layer and the second electrode layer.

In the above embodiments, when layers (films), regions, patterns, or elements are described in that they are formed on or under substrates, layers (films), regions, or patterns, it means that they are formed directly or indirectly on or under the substrates, layers (films), regions, or patterns.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a reflective structure layer comprising a dopant layer and a roughness layer;
   a first conductive semiconductor layer on the reflective structure layer;
   an active layer on the first conductive semiconductor layer; and
   a second conductive semiconductor layer on the active layer.

2. The semiconductor light emitting device as claimed in claim 1, wherein the reflective structure layer comprises a reflective layer in a portion on the roughness layer.

3. The semiconductor light emitting device as claimed in claim 2, wherein the reflective layer is formed in a concave portion of the roughness layer, and comprises one selected from the group consisting of $SiO_2$, $SiO_x$, $SiN_2$, $SiN_x$, $SiO_xN_y$, and ZnO.

4. The semiconductor light emitting device as claimed in claim 2, wherein the reflective layer is disposed in the roughness layer and has a different reflective index from the roughness layer.

5. The semiconductor light emitting device as claimed in claim 4, wherein the dopant layer is contacted under the reflective layer and the roughness layer and is spaced apart from each other.

6. The semiconductor light emitting device as claimed in claim 1, further comprising a first semiconductor layer under the dopant layer.

7. The semiconductor light emitting device as claimed in claim 6, wherein the first semiconductor layer comprises an undoped nitride semiconductor layer or a buffer layer.

8. The semiconductor light emitting device as claimed in claim 6, wherein the dopant layer has a plurality of dopants spaced apart from each other.

9. The semiconductor light emitting device as claimed in claim 1, wherein the first conductive semiconductor layer comprises an N-type semiconductor layer or a P-type semiconductor layer.

10. The semiconductor light emitting device as claimed in claim 1, further comprising a second semiconductor layer between the reflective structure layer and the first conductive semiconductor layer.

11. The semiconductor light emitting device as claimed in claim 1, further comprising a substrate under the dopant layer.

12. The semiconductor light emitting device as claimed in claim 1, wherein the dopant layer comprises an N-type dopant or a P-type dopant.

13. The semiconductor light emitting device as claimed in claim 1, wherein the roughness layer on the dopant layer comprises a sectional shape of an asymmetrical polyhedron or a trapezoid.

14. The semiconductor light emitting device as claimed in claim 1, wherein each roughness of the roughness layer comprises a vertical length greater than a lateral width by one to five times.

15. The semiconductor light emitting device as claimed in claim 1, wherein the roughness layer comprises one selected from the group consisting of GaN, InN, AlN, InGaN, AlGaN, InAlGaN and AlInN.

16. The semiconductor light emitting device as claimed in claim 1, wherein a thickness of the roughness layer ranges from about 100 nm to about 1 μm.

17. A semiconductor light emitting device comprising:
a first nitride semiconductor layer;
a first reflective structure layer comprising a dopant layer and a roughness layer, which comprises a concave-convex shape, on the first nitride semiconductor layer;
a first conductive semiconductor layer on the first reflective structure layer;
an active layer on the first conductive semiconductor layer; and
a second conductive semiconductor layer on the active layer.

18. The semiconductor light emitting device as claimed in claim 17, wherein the first reflective structure layer comprises a reflective layer in a concave portion of the roughness layer, in which the reflective layer comprises one selected from the group consisting of SiO2, SiOx, SiN2, SiNx, SiOxNy, and ZnO.

19. The semiconductor light emitting device as claimed in claim 17, further comprising a second reflective structure layer formed below the first nitride semiconductor layer.

20. The semiconductor light emitting device as claimed in claim 17, wherein the dopant layer comprises an N-type dopant or a P-type dopant comprising a shape of a grain, and the roughness layer comprises one selected from the group consisting of GaN, InN, AlN, InGaN, AlGaN, InAlGaN and AlInN.

* * * * *